(12) United States Patent
Buchanan

(10) Patent No.: US 9,911,495 B2
(45) Date of Patent: Mar. 6, 2018

(54) MEMORY CELL HAVING RESISTIVE AND CAPACITIVE STORAGE ELEMENTS

(71) Applicant: HEWLETT PACKARD ENTERPRISE DEVELOPMENT LP, Houston, TX (US)

(72) Inventor: Brent E. Buchanan, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/114,449

(22) PCT Filed: Jan. 31, 2014

(86) PCT No.: PCT/US2014/014046
§ 371 (c)(1),
(2) Date: Jul. 27, 2016

(87) PCT Pub. No.: WO2015/116142
PCT Pub. Date: Aug. 6, 2015

(65) Prior Publication Data
US 2016/0351260 A1 Dec. 1, 2016

(51) Int. Cl.
*G11C 11/40* (2006.01)
*G11C 14/00* (2006.01)
*G11C 11/16* (2006.01)
*G11C 11/24* (2006.01)
*G11C 13/00* (2006.01)

(52) U.S. Cl.
CPC .......... *G11C 14/0045* (2013.01); *G11C 11/16* (2013.01); *G11C 11/1659* (2013.01); *G11C 11/1673* (2013.01); *G11C 11/1675* (2013.01); *G11C 11/24* (2013.01); *G11C 13/0002* (2013.01); *G11C 13/003* (2013.01); *G11C 13/004* (2013.01); *G11C 13/0026* (2013.01); *G11C 13/0028* (2013.01); *G11C 13/0069* (2013.01); *G11C 2013/0052* (2013.01); *G11C 2013/0092* (2013.01); *G11C 2213/76* (2013.01)

(58) Field of Classification Search
CPC ............................ G11C 13/0002; G11C 13/00
USPC ................ 365/148, 149, 163, 171, 173, 158
See application file for complete search history.

(56) References Cited

U.S. PATENT DOCUMENTS

| | | |
|---|---|---|
| 8,331,137 B2 | 12/2012 | Takashima et al. |
| 8,411,485 B2 | 4/2013 | Nazarian et al. |
| 8,416,609 B2 | 4/2013 | Meade |
| 8,520,424 B2 | 8/2013 | Kreupl et al. |

(Continued)

OTHER PUBLICATIONS

Ahn, S-E. et al.; "Write Current Reduction in Transition Metal Oxide Based Resistance Change Memory"; Feb. 5, 2008; 3 pages.

(Continued)

*Primary Examiner* — Han Yang
(74) *Attorney, Agent, or Firm* — Trop, Pruner & Hu, P.C.

(57) ABSTRACT

A technique including using an array of memory cells for data storage. A given cell of the memory cells includes a capacitive storage element and a resistive storage element that is coupled in series with the capacitive storage element. The technique includes accessing the given memory cell to write a value to the given memory cell or read a value stored in the memory cell. The accessing includes applying a time varying voltage to the memory cell.

17 Claims, 8 Drawing Sheets

(56) References Cited

U.S. PATENT DOCUMENTS

| | | | |
|---|---|---|---|
| 2002/0018356 A1* | 2/2002 | Hoffmann | G11C 11/22 365/145 |
| 2006/0050545 A1* | 3/2006 | Rohr | G11C 13/0004 365/148 |
| 2010/0290271 A1* | 11/2010 | Lung | G11C 11/5614 365/163 |
| 2011/0240946 A1 | 10/2011 | Miao et al. | |
| 2012/0127779 A1 | 5/2012 | Scheuerlein et al. | |
| 2012/0236650 A1* | 9/2012 | Nazarian | G11C 13/0007 365/185.18 |
| 2012/0243293 A1* | 9/2012 | Takashima | G11C 11/5685 365/148 |
| 2012/0302029 A1 | 11/2012 | Mihnea et al. | |
| 2013/0003437 A1 | 1/2013 | Siau | |
| 2013/0094278 A1 | 4/2013 | Hou et al. | |
| 2013/0221316 A1 | 8/2013 | Greene et al. | |

OTHER PUBLICATIONS

The International Search Report and the Written Opinion of the International Searching Authority, dated Oct. 5, 2015; Int. Application No: PCT/US2014/014046; 11 Pages.

* cited by examiner

US 9,911,495 B2

MEMORY CELL HAVING RESISTIVE AND CAPACITIVE STORAGE ELEMENTS

BACKGROUND

Semiconductor memory devices typically are used in a computer system for purposes of storing data related to the various operations of the system. The memory device may be packaged as a unit in a semiconductor package to form a "memory chip," and several such chips may be assembled together in the form of a module (a dual inline memory module (DIMM), for example), such that several modules may form, for example, the system memory of the computer system.

A computer system has traditionally contained both volatile and non-volatile storage devices. In this manner, due to their relatively faster access times, volatile memory devices, such as dynamic random access memory (DRAM) devices, have traditionally been used to form the working memory for the computer system. To preserve computer system data when the system is powered off, data has traditionally been stored in non-volatile mass storage devices associated with slower access times, such as magnetic media-based or optical media-based mass storage devices.

The development of relatively high density, solid state non-volatile memory technologies is closing the gap between the two technologies, and as such, non-volatile memory devices are becoming increasingly used to form a working, persistent memory for both traditional "memory" and "storage" functions.

DETAILED DESCRIPTION

Techniques and systems are disclosed herein for purposes of forming a resistive storage element-based memory cell array in a manner in which the failure of a given cell of the array does not affect accesses to other cells of the array. As disclosed herein, the memory cells of the memory cell array are constructed to block direct current (DC) currents and are accessed using time-varying signals.

In this context, a "resistive storage element" generally refers to a non-volatile element whose resistance indicates a stored value and which may be may read or sensed (via a current, for example) to retrieve the stored value. Moreover, the state of the element may be changed/programmed via the voltage to cause the element to have a certain resistance and correspondingly set the value that is stored by the element. A bipolar Memristor cell, or resistive random access memory (RRAM) cell, is one example of such a resistive storage element, as further described herein. However, the systems and techniques that are disclosed herein may be used with other resistive storage elements, such as a unipolar RRAM cell, a phase change random access memory cell (PCRAM), a magnetoresistive random access memory cell (MRAM), and so forth.

Figure 1:
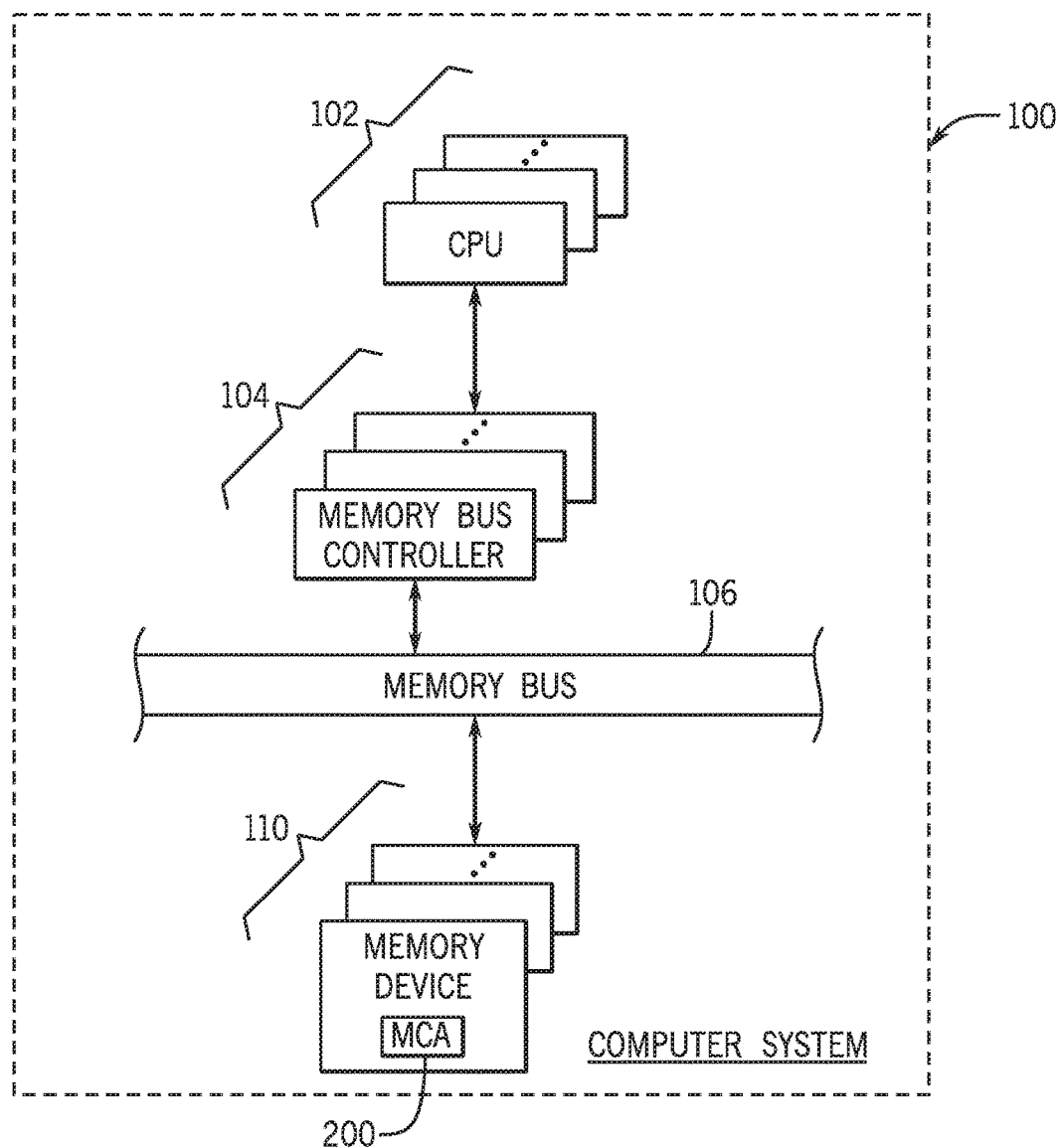
FIG. 1 is a schematic diagram of a computer system according to an example implementation.

Referring to FIG. 1, a memory cell array 200 that is formed from resistive storage elements may form part of a memory device 110 of a computer system 100 that is generally illustrated in FIG. 1. Referring to FIG. 1, the computer system 100 is a physical machine that is made up of actual hardware and actual software (i.e., machine executable instructions). In this regard, the computer system 100 may include one or multiple central processing units (CPUs); and each CPU 102 may include one or multiple processing cores. In this regard, the CPU 102 may be packaged inside a particular semiconductor package, which is constructed to be mechanically and electrically mounted to a motherboard of the computer system 100 via an associated connector, or socket. In this manner, the socket may be constructed to receive at least a portion of this semiconductor package, which contains the package's electrical contacts, and the socket has mechanical features to secure the semiconductor package to the socket. As a more specific example, in accordance with example implementations, the CPU 102 may be contained in a surface mount package, which has a land grid array (LGA) for purposes of forming electrical connections with corresponding pins of the receiving socket. Other semiconductor packages may be employed, in accordance with further example implementations.

As further depicted in FIG. 1, the computer system 100 may include one or multiple memory controllers 104. In this manner, in accordance with example implementations, one or multiple memory controllers 104 may be integrated into a given CPU 102 to allow processing core(s) of the CPU 102 to access one or multiple memory modules of the computer system 100 via a memory bus 106. Each memory module may include one or more of the memory devices 110.

In accordance with example implementations, the memory cell array is a crosspoint array that includes row lines and column lines such that memory cells of the array are associated with the intersections of the row and column lines. In this manner, in general, a given memory cell of the memory cell array 200 may be accessed (for purposes of reading a value from the cell or writing a value to the cell) by the row and column line pair that corresponds to the cell.

Figure 2:
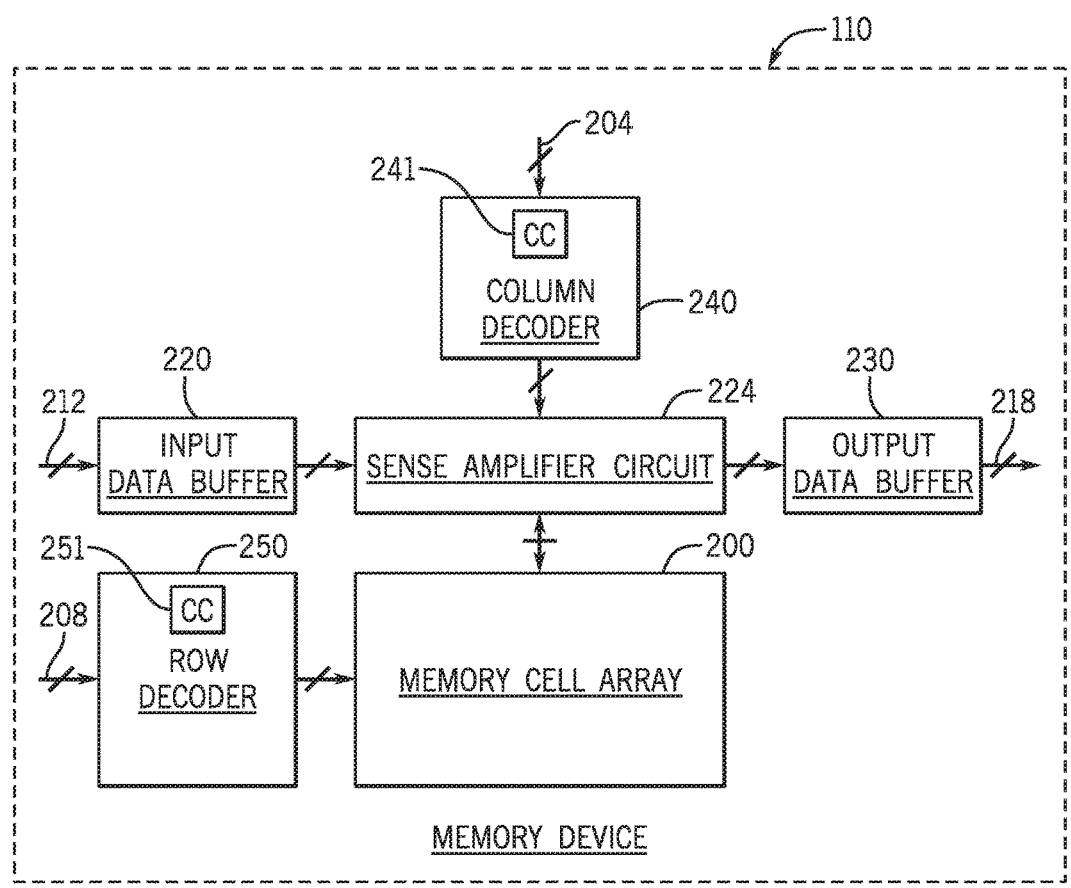
FIG. 2 is a schematic diagram of a memory device of the computer system of FIG. 1 according to an example implementation.

A targeted set of memory cells for a given memory operation is selected by column and row address signals that are received by the memory device 110. Referring to FIG. 2, in general, the memory device 110 includes a column decoder 240, which receives column address signals at its input terminals 204 in connection with targeted memory cells and decodes these signals to generate signals to select the corresponding column lines 404 of the memory cell array 200. The memory device 110 further includes a row decoder 250, which decodes row address signals at its input terminals 208 to generate signals to select the appropriate row line 400 of the memory cell array 200.

As depicted in FIG. 2, the memory device 110 further includes an input data buffer 220, which receives input data (via input terminals 212) associated with write operations. In accordance with example implementations, for a write operation, the input data may be communicated to a sense amplifier circuit 224 of the memory device 110, which generates the appropriate programming voltages on memory cells that are targeted by the write operation for purposes of writing values to the cells. For a read operation, the sense amplifier circuit 224 senses values stored in the memory cells that are targeted by the read operation to form corresponding values that are stored in an output data buffer 230. In this manner, the read data may be retrieved from output terminals 218 of the output data buffer 230.

It is noted that the memory device architecture of FIG. 2 is merely a simplified example of example components of the memory device 110, as the memory device 110 may have other architectures and other components, in accordance with further implementations.

Figure 3:
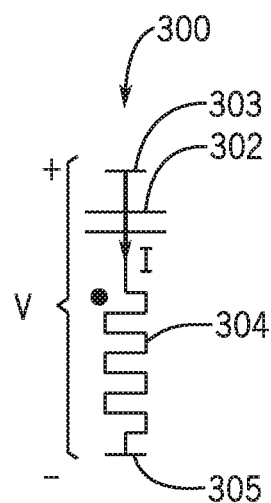
FIG. 3 is a schematic diagram of a memory cell according to an example implementation.

Referring to FIG. 3, in accordance with example implementations, a memory cell 300 of the memory cell array 200 (FIG. 2) includes a resistive storage element 304 and capacitive storage element 302 (i.e., a capacitor), which are coupled together in series between top 303 and bottom 305 electrodes of the cell 300. For the notation of FIG. 3, a current I may be induced in the memory cell 300 by applying a time-varying programming voltage V. Due to the presence of the capacitive storage element 302, if a DC voltage V is applied to the terminals of the memory cell 300, the current I is blocked. Therefore, should the resistive storage element 304 fail such that the element 304 becomes an electrical short circuit, no current is routed through the cell 300, which prevents a bad memory cell from affecting one or multiple other cells of the memory cell array 200.

When a time-varying voltage V however, is applied to the terminals of the memory cell 300, the capacitive element 302 allows the nonzero current I, which permits access to the memory cell 300. This access may be, for example, a write access, in which the voltage V sets the resistive state of the resistive storage element 304 for purposes of causing a corresponding value to be stored in the cell 300. In this manner, the polarity and magnitude of the time-varying voltage V allows the programming of the resistive element 304 to either have a low resistance state (LRS) or a high resistance state (HRS), which correspond to difference stored logic states. The access may also be a read access in which a lower magnitude, time varying voltage is applied to the memory cell 300 for purposes of sensing the resistance state of the resistive storage element 304 to sense the corresponding logic value that is stored by the memory cell 300.

Figure 4:
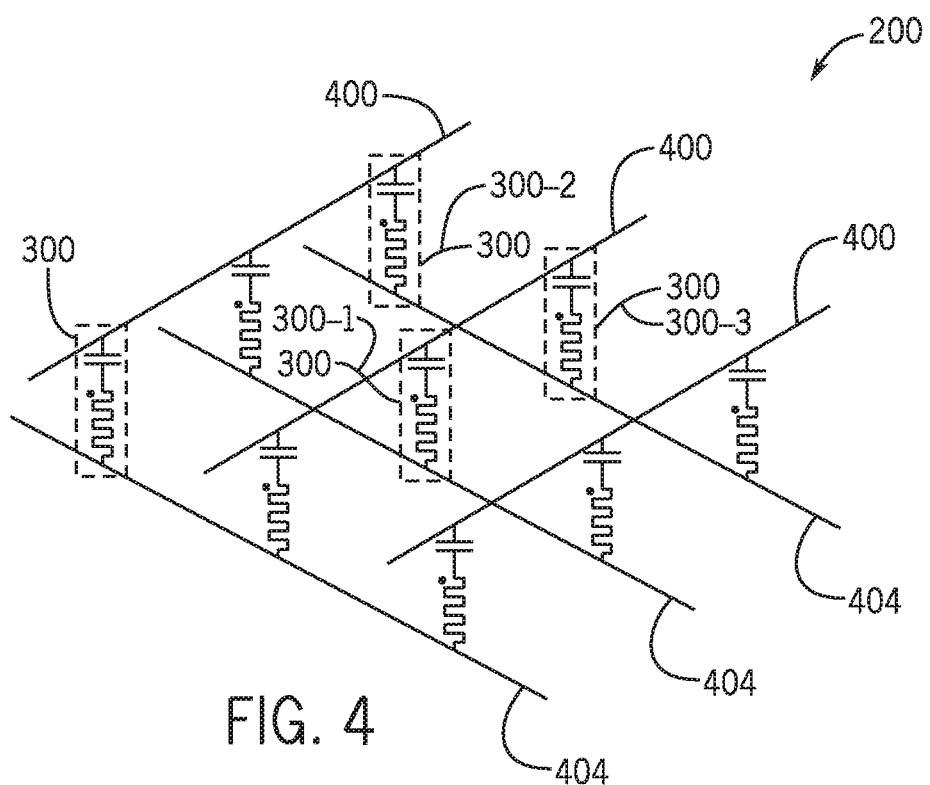
FIG. 4 is a schematic diagram of a memory cell array according to an example implementation.

Referring to FIG. 4 in conjunction with FIG. 3, in accordance with example implementations, the memory cell array 200 may be constructed to be a crosspoint array. In this manner, the array 200 includes row lines 400 and column lines 404; and each intersection of the row 400 and column 404 lines are associated with a corresponding memory cell 300. Referring to FIG. 4 in conjunction with FIG. 3, the top electrodes 303 (FIG. 3) of the memory cells 300 are coupled to the row lines 400, and the bottom electrodes 305 of the memory cells 300 are coupled to the column lines 404. Thus, for example, a given memory cell 300-1 of FIG. 4 may be accessed through the combination of the associated row line 400-1 and the associated column line 404-1.

Accessing the memory cell 300-1 involves applying a time-varying voltage across the memory cell 300-1, which, depending on the magnitude and polarity of the voltage, may produce a current that is negative, positive or zero. For this purpose, the row decoder 250 and/or column decoder 240, depending on the particular implementation may include a control circuit (control circuit 251 of the row decoder 250 FIG. 2 and/or control circuit 241 of the column decoder 240 of FIG. 2) that is constructed to generate a time varying voltage on the row 400 and/or column 404 lines, as further described herein.

More specifically, for the following examples, the time-varying voltages that may be applied to the memory cell 300-1 are illustrated in FIGS. 5A, 5C, 5E, 5G, 5I, 5K, 5M and 5O. These voltages produce currents in the memory cell 300-1 that may range from approximately −2 nanoamps (nA) to +2 nA, in accordance with example implementations. By varying the polarity, magnitude and time-voltage profile that are applied to the memory cell 300-1, the cell 300-1 may be accessed to sense or set the resistive state of the cell 300-1 for a particular read or write operation. As further described below in view of examples, one of both of the top and bottom electrodes may receiving time varying voltages. Moreover, the top and bottom electrode voltages may change together, resulting in no time-varying voltage being applied across the memory cell 300-1, thereby causing no current to exist in the cell 300-1.

Figure 5A:
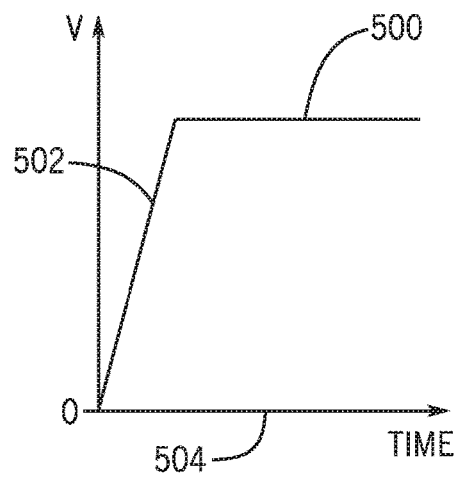
FIGS. 5A, 5C, 5E, 5G, 5I, 5K, 5M and 5O illustrate time-varying waveforms used to access a memory cell according to example implementations.
Figure 5B:
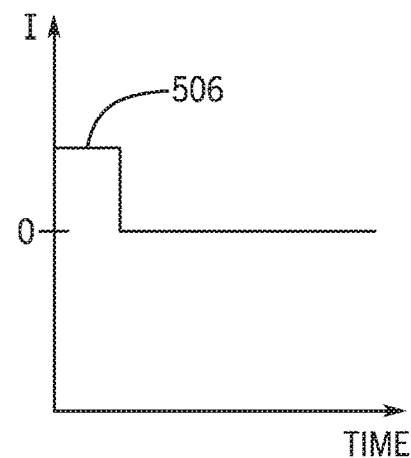
FIGS. 5B, 5D, 5F, 5H, 5J, 5L, 5N and 5P illustrate currents for the memory cell in response to the waveforms of FIGS. 5A, 5C, 5E, 5G, 5I, 5K, 5M and 5O, respectively according to example implementations.

More specifically, FIG. 5A depicts a voltage 500 that is applied to the top electrode of the memory cell 300-1 and has a positive rate change of 0.5 V/ns for an illustrated ramping portion 502 of the voltage. A voltage 504 of the bottom electrode for this example remains at ground. The resulting time-varying voltage that is applied across the memory cell 300-1 produces a positive current pulse, as indicated in a current waveform 506 of FIG. 5B.

Figure 5C:
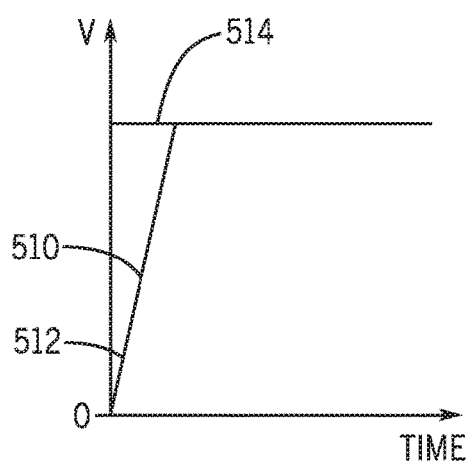
Figure 5D:
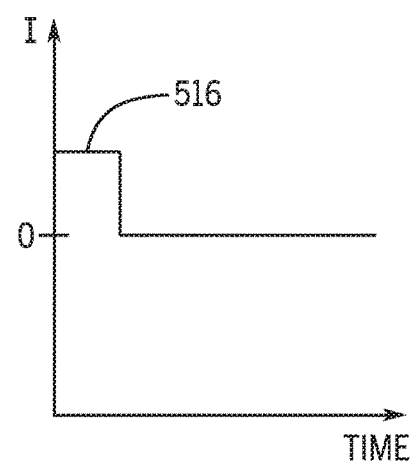

FIG. 5C depicts a variation in which a voltage 510 of the top electrode again includes a ramping portion 512 that varies at 0.5 V/ns. For this example, a voltage 514 of the bottom electrode is held at one volt. Because the bottom electrode voltage 514 is static, the same positive current pulse is produced in the memory cell 300-1 as for the voltages of FIG. 5A, as illustrated by current waveform 516 of FIG. 5D.

Figure 5E:
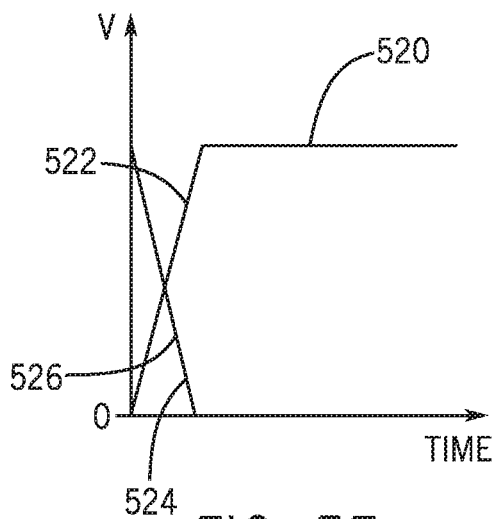
Figure 5F:
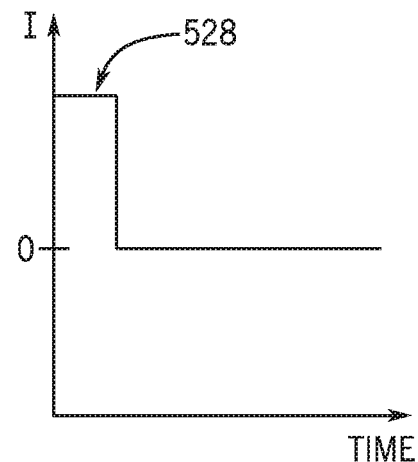

FIG. 5E depicts a variation in which time-varying voltages are applied to both the top and bottom electrodes of the memory cell 300-1. In this regard, FIG. 5E illustrates a voltage 520 that is applied to the top electrode and has a ramping portion 522 that varies at 0.5 V/ns; and FIG. 5E also illustrates a voltage 524 that is applied to the bottom electrode and has a negative ramping portion 526 that varies at −0.5 V/ns. The net result is that a positive time-varying voltage is applied across the memory cell 300-1, which produces a positive current pulse, as illustrated in a current waveform 528 of FIG. 5F.

Figure 5G:
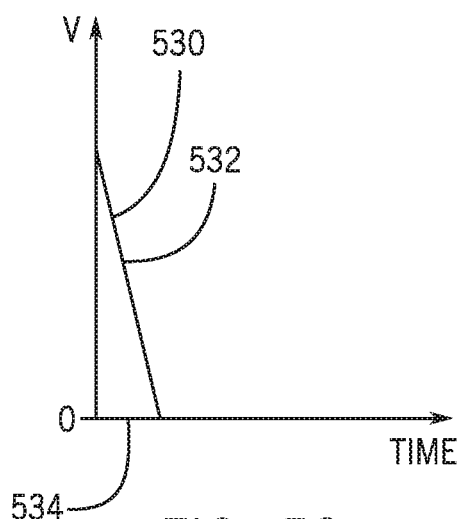
Figure 5H:
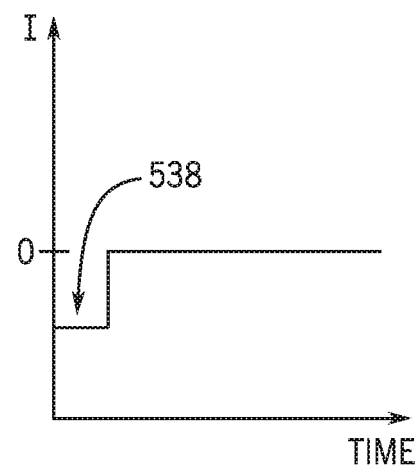

FIG. 5G illustrates an application of top 530 and bottom 534 electrodes voltage to the memory cell 300-1 to produce a negative current pulse in the memory cell 300-1, as illustrated by current waveform 538 of FIG. 5H. In this manner, the top electrode voltage 530 has a negative ramping portion 532 with a time-varying rate of −0.5 V/ns; and the bottom electrode receives a ground voltage 534.

Figure 5I:
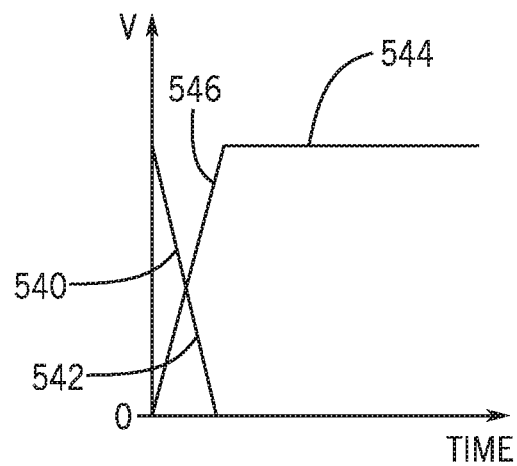
Figure 5J:
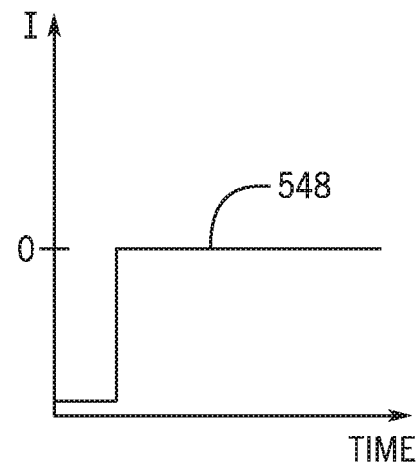

Referring to FIGS. 5I and 5J, a larger negative current pulse may be produced in the memory cell 300-1 (as illustrated by a current waveform 548 in FIG. 5J) by applying voltages 544 and 540 to the top and bottom electrodes, respectively. In this manner, as illustrated in FIG. 5I, the voltage 540 that is applied to the top electrode has a negative ramping portion 542 that varies at rate of −0.5 V/ns;

and the voltage 544 that is applied to the bottom electrode for this example has a positively ramping portion 546 that varies at a rate of 0.5 V/ns.

Figure 5K:
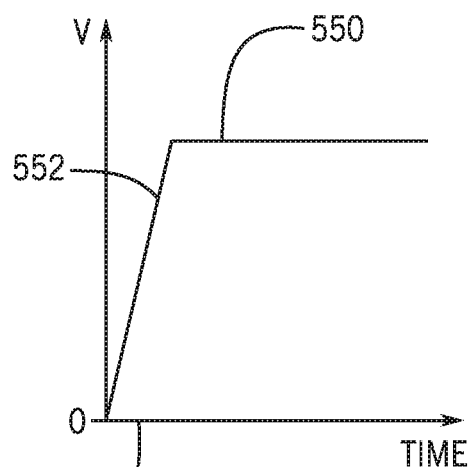
Figure 5L:
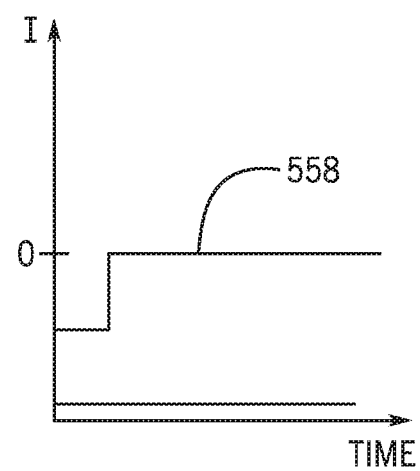

FIGS. 5K and 5L depict another example in which a negative current pulse (see current waveform of FIG. 5L) is produced in the memory cell 300-1 by maintaining a static ground voltage 554 on the top electrode, while applying a time-varying voltage 550 that has a positive ramping portion 552 that varies at 0.5 V/ns.

Figure 5M:
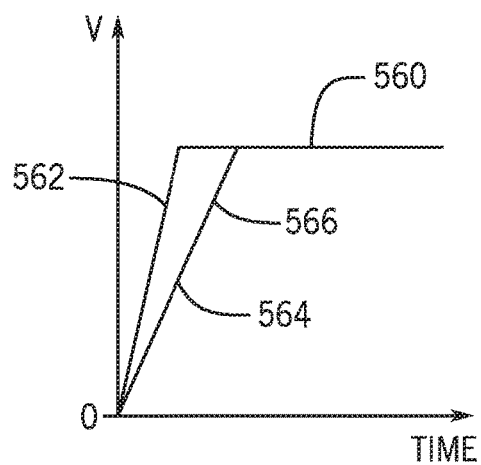
Figure 5N:
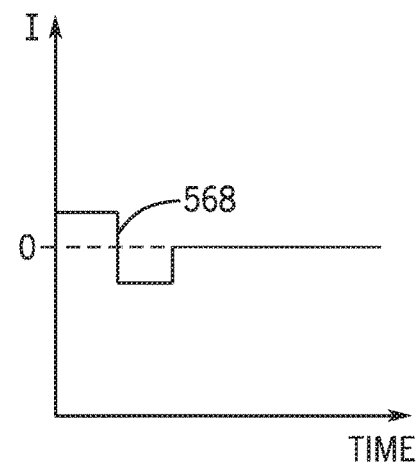

Many other variations are contemplated and are within the scope of the appended claims. For example, FIG. 5M depicts the application of two positive time-varying voltages 560 and 564 to the top and bottom electrodes, respectively, of the memory cell 300-1 for purposes of producing both negative and positive currents in the memory cell 300-1, as illustrated in current waveform 568 of FIG. 5N. In this manner, for this example, the top electrode voltage 560 has a positive ramping portion 562 that varies at 0.5 V/ns; and the bottom electrode voltage 564 has a positive ramping portion 566, which varies at 0.25 V/ns.

Figure 5O:
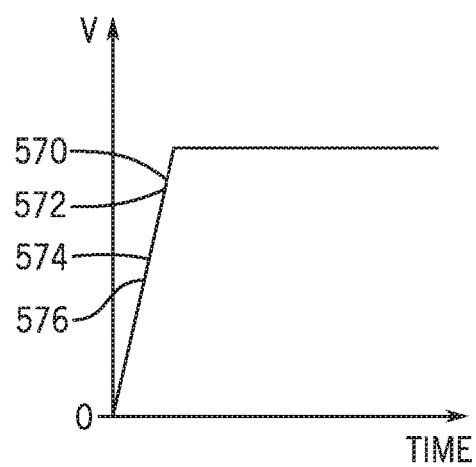
Figure 5P:
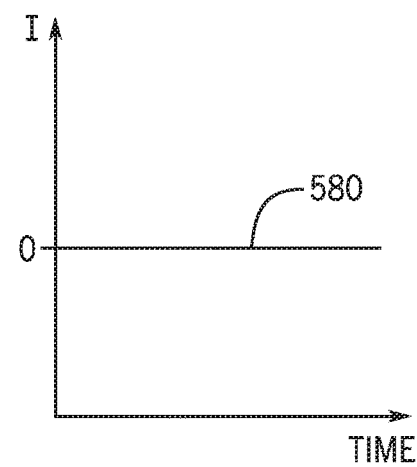

FIGS. 5O and 5P illustrate that the application of time-varying voltages to the top bottom electrodes of the memory cell 300-1 does not necessarily produce a current in the cell. In this regard, FIG. 5O shows voltages 570 and 574 that are applied to the top and bottom electrodes, respectively. The voltages 570 and 574 each have respective portions 572 and 576 that vary at the same rate of 0.5 V/ns, i.e., the voltages 570 and 574 are identical. Because of this relationship, a static voltage is effectively applied across the memory cell 300-1 to cause no current to be routed through the cell 300-1, as illustrated by a current waveform 580 of FIG. 5P.

Figure 6:
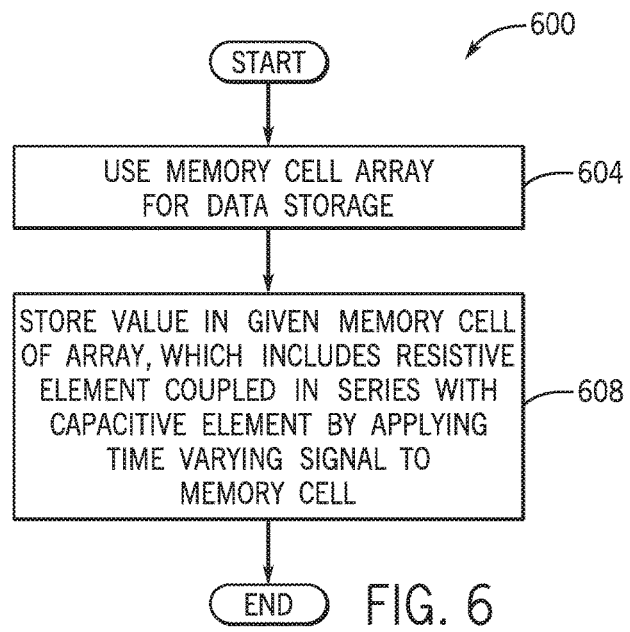
FIG. 6 is a flow diagram depicting a technique to access a memory cell according to an example implementation.

Referring to FIG. 6, thus, in accordance with example implementations, a technique 600 includes using (block 604) an array of memory cells for data storage and accessing (block 608) a given memory cell of the array, which includes a resistive element that is coupled in series with a capacitive element, by applying a time-varying signal to the memory cell.

Figure 7:
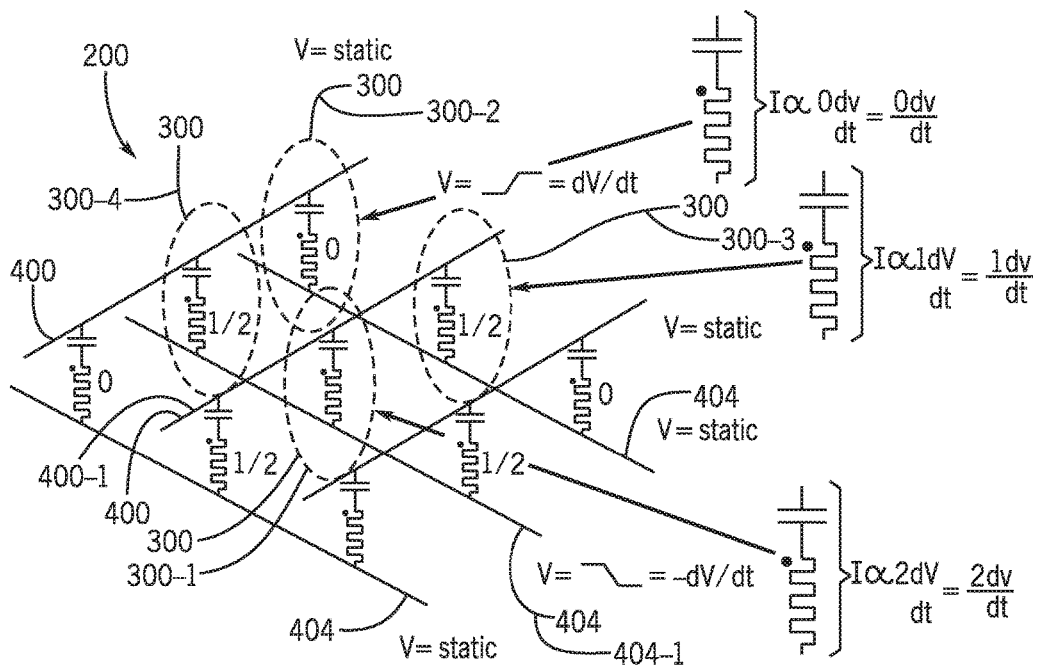
FIG. 7 is a schematic diagram of a memory cell array illustrating memory cell voltages when a given memory cell of the array is accessed according to an example implementation.

Referring to FIG. 7, in accordance with example implementations, a memory cell array 200 may be formed from the memory cells 300. The memory cell array 200, in accordance with example implementations, is a crosspoint array that is formed from row lines 400 and column lines 404. Memory cells 300 of the array 200 are associated with the intersections of the row and column lines. In this manner, a given memory cell 300 of the memory cell array 200 may be accessed (for purposes of reading a value from the cell or writing a value to the cell) by the row and column line pair that corresponds to the cell 300. A targeted set of memory cells for a given memory operation is selected by column and row address signals that are received by the memory device 110.

FIG. 7 illustrates an access to memory cell 300-1, a cell 300 that is addresses via a row line 400-1 and a column line 404-1. For this example, the row line 400-1 receives a positive ramp voltage, and the column line 404-1 receives a negative ramp voltage. The current that appear in the memory cell 300-1 as well as the currents that appear in example neighboring memory cells 300-2, 300-3 and 300-4 are also illustrated in FIG. 7. The memory cells 300 that are disposed on the same row line 400-1 (such as cell 300-3) and column line 404-1 (such as cell 300-4) each receives one half of the current that appears in the memory cell 300-1; and the other cells 300 (such as cell 300-2) have zero currents, as time varying voltages are not applied across these other cells 300.

It is noted that FIG. 7 is merely an example of how time-varying waveforms may be applied to a selected memory cell 300 to access the cell 300. Many other waveform combinations are contemplated, in accordance with further example implementations. It is noted that if, for this example, the selected memory cell 300-1 is shorted, the corresponding row 400-1 and column 404-1 lines may be held to static voltages or alternatively, moved in unison to ensure that current does not flow through the shorted cell and allow other cells to remain accessible for reads and writes. If a memory cell 300 on the same row and column lines as a shorted bit cell has one terminal that is held to a static voltage, then using the other waveforms with this example, twice the time-varying voltage is applied to the other terminal to obtain the same access current. If instead of holding the wires to the shorted bit cell static, such that the terminals may be moved in unison, there may be greater degree in designing the waveforms used to access the other cells in its row and column.

Other implementations are contemplated, which are within the scope of the appended claims. For example, the memory cells, memory cell arrays and memory cell devices that are described herein may be accessed by a device other than a CPU. For example, the memory may be accessed by a direct memory access (DMA) engine. As another example, a memory may store digital samples of an audio recording, and these samples may be spooled to a digital-to-analog converter (ADC), which then outputs the original analog signal, with no CPU being involved. In further implementations, the memory cell may be a multilevel cell (MLC), which stores more than two states. In this manner, a given cell may store two bits (00, 01, 10 or 11) which are indicated by the resistance (100, 400, 700 or 1000 ohms, as an example) in a range of discrete resistances for the cell. Moreover, the resistive storage element of the cell may store an analog value, which is represented by a resistance within a continuous range of resistances (100 to 1000 ohms, for example) for the cell.

Among the potential advantages of the systems and techniques that are disclosed herein, a shorted bit cell in a crosspoint array is blocked when conducting DC current and as such, does not prevent access other cells in the array, thereby greatly reducing the negative impact of a shorted cell. Other and different advantages are contemplated, in accordance with the scope of the appended claims.

While the present invention has been described with respect to a limited number of embodiments, those skilled in the art, having the benefit of this disclosure, will appreciate numerous modifications and variations therefrom. It is intended that the appended claims cover all such modifications and variations as fall within the true spirit and scope of this present invention.

What is claimed is:

1. A method comprising:
    using an array of memory cells for data storage, a given memory cell of the memory cells comprising a capacitive storage element and a resistive storage element that are coupled in series between a row electrode connected to a row line of the array and a column electrode connected to a column line of the array, the capacitive storage element connected to the row electrode and the resistive storage element connected to the column electrode; and
    accessing the given memory cell to write a value to the given memory cell or read a value stored in the memory cell, comprising applying a time varying voltage that increases to and remains at a maximum value to write a value to the given memory cell or read a value stored in the memory cell, or that decreases to and remains at a minimum value to the row electrode to write a value to the given memory cell or read a value stored in the memory cell.

2. The method of claim 1, wherein the accessing comprises applying the time varying voltage to the given memory cell to program a resistance state of the resistive storage element.

3. The method of claim 1, wherein the accessing comprises applying a time varying voltage to the given memory cell to sense a resistance state of the resistive storage element.

4. The method of claim 3, wherein the resistance state comprises a resistance selected from a group of discrete resistances for the given cell or a resistance selected from a continuous range of resistances for the given cell.

5. The method of claim 1, wherein the resistive storage element comprises a unipolar resistive storage element or a bipolar resistive storage element.

6. The method of claim 1, wherein the time varying voltage increases to and remains at the maximum value,
and wherein accessing the given memory cell further comprises applying a static zero voltage to the column electrode.

7. The method of claim 1, wherein the time varying voltage increases to and remains at the maximum value,
and wherein accessing the given memory cell further comprises applying a static voltage of the maximum value to the column electrode.

8. The method of claim 1, wherein the time varying voltage is a first time varying voltage that increases to and remains at the maximum value,
and wherein accessing the given memory cell further comprises applying a second time varying voltage that decreases from the maximum value to the minimum value.

9. The method of claim 1, wherein the time varying voltage decreases to and remains at the minimum value,
and wherein accessing the given memory cell further comprises applying the time varying voltage to the column electrode.

10. The method of claim 1, wherein the time varying voltage is a first time varying voltage that increases to the maximum value at a first rate,
and wherein the accessing the given memory cell further comprises applying a second time varying voltage that increase to the maximum value at a second rate different than the first rate.

11. An apparatus comprising:
an array of memory cells, a given memory cell of the array of memory cells comprising a capacitive storage element and a resistive storage element that are coupled in series between a row electrode connected to a row line of the array and a column electrode connected to a column line of the array, the capacitive storage element connected to the row electrode and the resistive storage element connected to the column electrode; and
a circuit to apply a time-varying voltage that increases to and remains at a maximum value to read a value stored by the memory cell or write the value to the memory cell or that decreases to and remains at a minimum value to the row electrode of the given memory cell to read a value stored by the memory cell or write the value to the memory cell.

12. The apparatus of claim 11, wherein the circuit further applies the time-varying voltage to the column electrode.

13. The apparatus of claim 11, wherein the circuit further applies a static voltage to the column electrode.

14. The apparatus of claim 11, wherein the circuit applies a time-varying voltage that increase to and remains at a maximum value or that decreases to and remains at a minimum value to the given memory cell to access the given memory cell, and the circuit applies static voltages to memory cells of the array not associated with the row line and the column line.

15. An apparatus comprising:
a row line;
a column line;
a memory cell to be accessed in response to selection of the row and column lines, wherein the memory cell comprises a resistive storage element and a capacitive storage element coupled in series between the row line and the column line, the capacitive storage element connected to the row line and the resistive storage element connected to the column line; and
a circuit to apply a time-varying voltage that increases to and remains at a maximum value to read a value stored by the memory cell or write the value to the memory cell or that decreases to and remains at a minimum value to the row electrode of the given memory cell to read a value stored by the memory cell or write the value to the memory cell.

16. The apparatus of claim 15, wherein the resistive storage element comprises a unipolar resistive storage element or bipolar resistive storage element.

17. The apparatus of claim 15, wherein the memory cell blocks a non-time-varying current.

* * * * *